ELECTRONIC RING COUNTER

Filed April 3, 1962

INVENTORS
William J. Mahoney &
Nanjundiah N. Murthy
BY
[signature]
ATTORNEYS

United States Patent Office
3,235,748
Patented Feb. 15, 1966

3,235,748
ELECTRONIC RING COUNTERS

William J. Mahoney, Darien, and Nanjundiah N. Murthy, Norwalk, Conn., assignors to American Machine & Foundry Company, a corporation of New Jersey
Filed Apr. 3, 1962, Ser. No. 184,766
10 Claims. (Cl. 307—88.5)

Figures 1, 2:
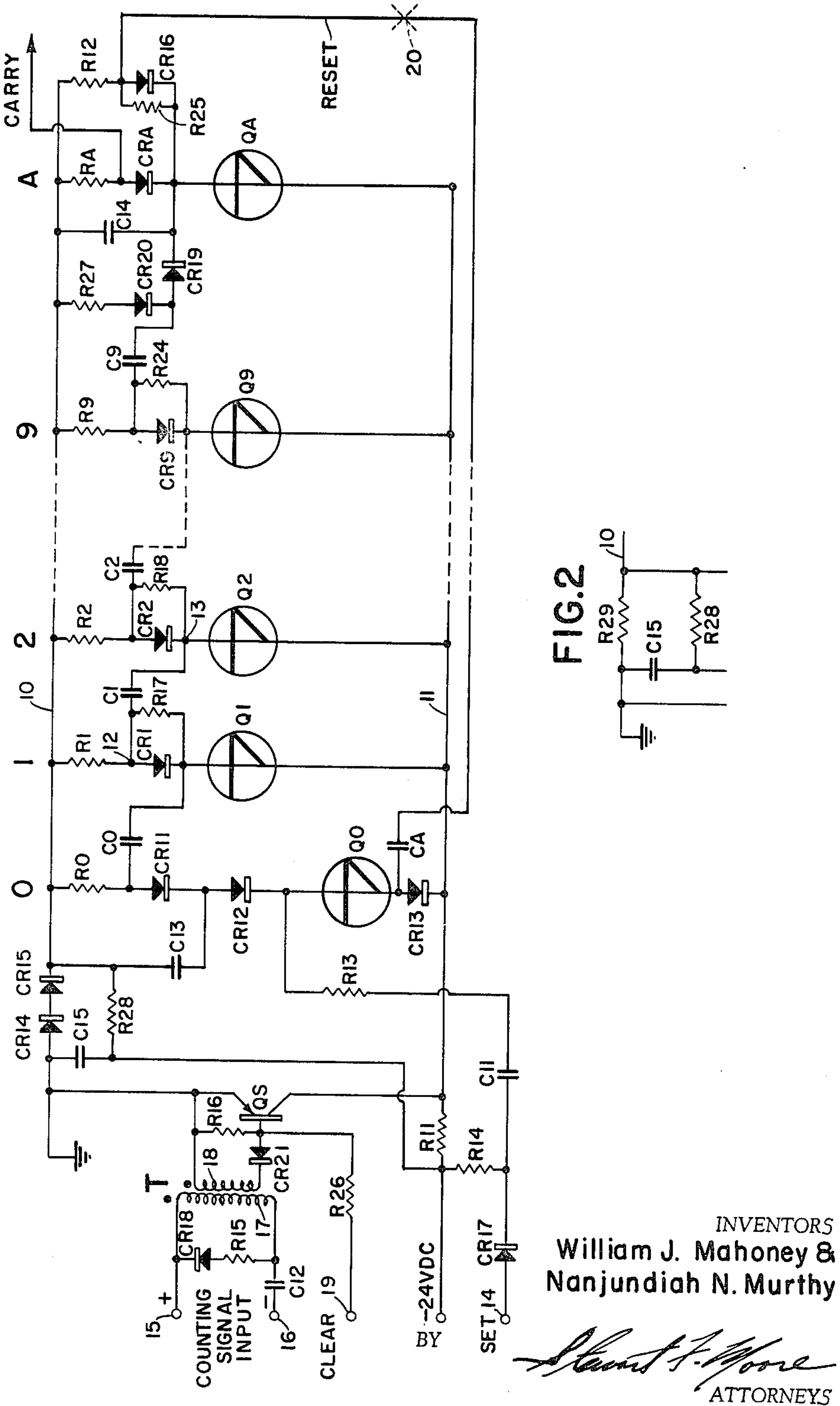

This invention relates to counters, especially ring counters.

In such counters, it is desirable to be able to obtain count information directly from each stage, and at the same time to use as few components as possible. There are counters in existence which achieve these results by the use of regenerative threshold devices as the active elements. Such counters have been designed requiring only one active element per stage and still permitting count information to be taken from each stage.

A threshold element, as used herein, refers to an active device requiring for the initiation of conduction a voltage across it in excess of a characteristic threshold voltage; but which, once triggered into conduction, will remain in conduction at a greatly reduced voltage until turned off by current starvation, or by collapse or reversal of the voltage across it. Threshold elements include, but are not limited to, four-layer semiconductor diodes and neon tubes.

In one type of counter which has been developed, cascaded stages are parallel connected between two buses, with each stage containing one threshold element. Only one stage is in conduction at any time, and the counter is stepped by turning off (rendering nonconductive) the conductive stage and triggering on (rendering conductive) the next succeeding stage. This invention comprises an improved counter of the type described.

One object of this invention is to provide such a counter having more rapid and more positive turnoff of the conducting stage.

It is another object of this invention to provide such a counter having a simple and convenient CLEAR capability, that is, a means for rendering all stages nonconductive.

It is a further object of this invention to provide such a counter having a convenient and versatile RESET means for automatically turning on the zero stage once the last counting stage is turned off, and in which the zero stage may also be turned on (SET) by separate means unrelated to the state of conduction of the last counting stage.

It is still another object of this invention to provide such a counter which will generate a CARRY signal for application to a subsequent counter once the last counting stage is turned off.

It is a still further object of this invention to provide such a counter in which the SET, RESET and CARRY signals are isolated from each other so that interaction between them will not result in spurious signals.

The counter of this invention, the scope of its improvement over standard counters of this type, and the means by which it achieves the above objectives, are outlined broadly and briefly immediately below and are described more fully in the detailed description and the drawings.

In the conventional counter of this type, the switch, which may be a semiconductor device, is connected between the two buses. When the switch is actuated, the voltage across the buses is collapsed to a small value approaching zero. The length of time the switch remains actuated, called the switching period, is sufficient to ensure turn off of the conducting stage. At the end of the switching period, when the normal potential difference between the two buses is restored, none of the stages would normally turn on, since the potential difference across the buses is less than the threshold voltage of the threshold devices. For this reason, a triggering means, normally a capacitor connecting each two adjacent stages, is provided to couple to the next succeeding stage the extra voltage pulse required to trigger it into conduction.

In the counter of this invention, means is provided to reverse the polarity of the voltage across the threshold elements during the switching period. This polarity reversal provides a faster and more positive turnoff of the conducting stage than in a conventional counter of this type. In the latter, a small potential difference favoring conduction normally remains across the threshold element during the switching period. This is due to the potential drop existing across the actuated switch.

Provision is made for disabling the triggering means when the switch is actuated for a clearing period, which is a period of time greatly in excess of the normal switching period. This is done, for instance, where the triggering means comprises capacitors connecting adjacent stages, by providing a timed leakoff of the capacitor charge such that during the extended clearing period, but not during the short switching period, sufficient charge will leak off the capacitor to render it incapable of triggering the next succeeding stage into conduction when the switch is no longer actuated.

RESET of the zero stage and generation of a CARRY signal to be applied to a subsequent counter are effected by means of a noncounting auxiliary stage which is added following the last counting stage. The auxiliary stage is turned on when the last counting stage is turned off. The turn on of the auxiliary stage generates both a CARRY signal for the next counter and a RESET signal for the zero stage. These two signals are isolated from each other to prevent any spurious signals resulting from their interaction.

A separate SET input to the zero stage is provided so that it may be rendered conducting regardless of the condition of conduction of the last counting stage. This separate SET input is also isolated from the carry signal.

The counter of this invention may be more fully understood from the following detailed description taken in conjunction with the drawings in which:

FIG. 1 is a detailed schematic diagram of an embodiment of this invention in a decade ring counter utilizing four-layer diodes as active elements; and FIG. 2 is a schematic diagram of a portion of the ring counter of FIG. 1 showing a slightly different method of obtaining polarity reversal across the active elements.

Both FIGS. 1 and 2 show the invention embodied in counters using four-layer semiconductor diodes, or Shockley diodes, as they are frequently called, as the threshold elements.

The four-layer diode is a semiconductor device having an anode and a cathode and requiring for the initiation of conduction a voltage across the anode and cathode of proper polarity and of amplitude greater than the characteristic threshold voltage of the device. Prior to the initiation of conduction, the four-layer diode has a high impedance; after the appropriate voltage is applied and the diode begins to conduct, it assumes a low impedance. It maintains this low impedance conductive state even after the high triggering voltage has been withdrawn from its terminals. It will remain in conduction until turned off by current starvation (the reduction of the current through the device to a value below that necessary to sustain conduction) or until the voltage across its anode and cathode is reduced substantially to zero or has its polarity reversed. The device then becomes nonconductive and assumes its high impedance state.

Referring now to FIG. 1, a cascaded series of stages is parallel connected between a main bus 10 and a switching bus 11. The counting stages correspond to the numerals 0, 1, 2, . . ., 9; and the numeral to which a stage corresponds appears above the stage on the diagram. One stage, and only one, is normally in conduction at any time. The counting operation is performed by successively advancing the position of the conducting stage.

Each of the counting stages 0, 1, 2, . . ., 9 is composed of a four-layer diode, a conventional diode, and a load resistor, all series connected. The zero stage includes some additional diodes whose function will be explained below. In the drawing, excepting the zero stage, the three series elements in each counting stage are given designations corresponding to the number of the stage, i.e., for the first stage, the four-layer diode is Q1, the conventional diode is CR1 and the load resistor is R1. The anode of the four-layer diode is connected to the cathode of the conventional diode and the anode of the conventional diode is connected to one end of the load resistor. The cathode of the four-layer diode is connected to switching bus 11 and the other end of the load resistor is connected to main bus 10. In the zero stage, two conventional diodes CR11 and CR12 are series connected between the anode of four-layer diode Q0 and one end of load resistor R0. Another conventional diode CR13 is connected in series with the cathode of Q0. All three conventional diodes CR11, CR12 and CR13 are connected in the same sense as four-layer diode Q0, that is, they are connected to support conduction in the same direction as Q0. The zero stage is also connected between buses 10 and 11, with one end of load resistor R0 being connected to bus 10 and the cathode of diode CR13 being connected to bus 11.

A capacitor interconnects each pair of adjacent stages. The designation of each capacitor corresponds to the first of the two stages which it connects, thus capacitor C1 connects stages one and two, capacitor C2 connects stages two and three, etc. Each capacitor is connected from the anode of a conventional diode in the preceding stage to the anode of the four-layer diode in the succeeding stage, thus capacitor C1 is connected from the anode of diode CR1 in stage one to the anode of four-layer diode Q2 in stage two. Capacitor C0 is connected from the anode of diode CR11 in stage zero to the anode of four-layer diode Q1 in stage one.

Main bus 10 is connected through conventional diodes CR14 and CR15 to ground, and switching bus 11 is connected through resistor R11 to minus 24 v. D.C. A switch, comprising transistor QS, is connected between buses 10 and 11 and is effective when actuated (when conducting) to collapse the voltage between buses 10 and 11. The exact nature of the potential difference between the buses during the period of switch actuation will be described in detail below.

To understand the operation of this basic counter, assume that stage one is turned on, that is, four-layer diode Q1 is conducting. The voltage across buses 10 and 11 is of the proper polarity to sustain conduction, and load resistor R1 is small enough so that sufficient current may pass through Q1 to sustain conduction. The voltage at point 12, the connection between CR1 and load resistor R1 of stage one, will be essentially the negative voltage of switching bus 11, differing from the voltage at bus 11 only by the small voltage drop across the two conducting diodes CR1 and Q1. The voltage at point 13, which is the connection of the anode of four-layer diode Q2 to the cathode of conventional diode CR2 in stage two, will be essentially the voltage at main bus 10, since stage two is not conducting. Thus capacitor C1 will be charged to a voltage which is essentially the supply voltage across buses 10 and 11, with the lefthand plate of C1 being negative with respect to the righthand plate.

To advance the counter, switching transistor QS is triggered into conduction. The collapse of the potential difference between buses 10 and 11 for the duration of the switching period turns off stage one.

At the end of the switching period, transistor QS becomes nonconductive again, and the original potential difference between buses 10 and 11 is restored. This potential difference alone is not sufficient to initiate conduction in any of the stages, since it is substantially less than the threshold voltage of the four-layer diodes. An additional voltage pulse will therefore be required in order to initiate conduction in the next succeeding stage, stage two. This additional voltage is supplied by the capacitors which interconnect each pair of adjacent stages. These capacitors are referred to herein as triggering capacitors, since their function is to trigger the next stage into conduction. In the example being followed, when stage one suddenly becomes nonconductive, the voltage at point 12 jumps from the negative voltage of bus 11 to the positive voltage of bus 10. The voltage across capacitor C1 cannot change instantaneously, since it has no convenient discharge path, and thus the righthand plate of C1 has its voltage increased by an equal amount. The four-layer diode Q2 of stage two will now have impressed across it the supply voltage plus the additional positive voltage pulse appearing on the righthand plate of C1. The sum of these two voltages will exceed the four-layer diode threshold voltage and Q2 will be triggered into conduction.

The position of the conducting stage may thus be stepped along by successively actuating and deactivating the switching means. The switch, transistor QS, will be actuated (made conductive) for a switching period in order to turn off the conducting stage. As soon as the switch is opened, the next successive stage will go into conduction.

Actuation of switching transistor QS is effected by applying a signal pulse across terminals 15 and 16 of the counting signal input, with the pulse driving terminal 15 positive with respect to terminal 16. This pulse is applied to the primary winding 17 of pulse transformer T, which is in series with capacitor C12. A triggering pulse of the same polarity is developed across secondary winding 18 and is applied between the base and emitter of transistor QS, turning it on. It has been found that a switching period of five microseconds duration is sufficient to turn off a four-layer diode, so pulse transformer T is designed to supply a pulse across the transistor input of that duration before the impedance of the transformer colapses. The series combination of resistor R15 and diode CR18 is placed across primary winding 17 of pulse transformer T in order to prevent any pulses of the wrong polarity due to ringing in the transformer by effectively shorting them across the primary. Resistor R16 is of course the standard transistor base resistor.

Count information may be conveniently taken from each stage at any point between the series resistor and the anode of the four-layer diode.

The general arrangement of the counting stages and buses, and the basic method of operation, are conventional. In addition, in the conventional decade ring counter of this design, a triggering capacitor would be connected from the anode of the conventional diode in the ninth stage, here CR9, to the anode of the threshold device in the zero stage, here four-layer diode Q0, in order to provide for RESET of the zero stage when the ninth stage is turned off.

Improvements upon this conventional ring counter design which comprise the invention will be described in detail below.

*Reset and carry*

It is desirable, when the ninth stage is turned off, to provide not only a RESET pulse to the zero stage, but also a CARRY signal to initiate conduction in a subsequent ring counter. Thus, in a decade counter system, when the ninth stage of the units counter is extinguished, it is desirable to indicate the number 10 by putting into conduction the "one" stage of the tens decade as well as the zero stage of the units decade. In addition to these functions, it is desirable also to provide a SET capability, that is an input to stage zero whereby it may be turned on irrespective of the condition of conduction of stage nine. If the CARRY signal is taken from the zero stage, and the zero stage also contains a SET input, it has been found that a SET signal may cause, through interaction, a false CARRY signal to be transmitted to the next counter.

To avoid this, an auxiliary, noncounting stage has been added after the ninth counting stage. This stage, designated as A in FIG. 1, comprises basically a series combination of a four-layer diode QA, a conventional diode CRA and a load resistor RA, connected together and to buses 10 and 11 in a manner similar to the components of the counting stages. This stage is added primarily to provide the CARRY signal output and isolate it from the SET input to the zero stage. It is designed to be triggered into conduction along with the zero stage when the ninth stage is turned off. The obvious way to accomplish this would be to trigger both the auxiliary stage and the zero stage from the ninth stage. This would require a coupling condenser from the ninth stage to the auxiliary stage and from the ninth stage to the zero stage. It is found in practice that, due to variations in circuit parameters, it would be impossible to turn on the auxiliary stage and the zero stage exactly simultaneously. The second of the two stages to be turned on would draw current from the first through the two coupling capacitors which have a common connection point in stage nine, and would thus turn off the stage which had been turned on first.

In order to avoid this difficulty, stage nine is made to turn on only the auxiliary stage, and the auxiliary stage, as soon as it is turned on, will in turn turn on the zero stage. This operational sequence is effected by connecting triggering capacitor C9 from the anode of diode CR9 to the anode of four-layer diode QA in the auxiliary stage. The series combination of resistor R12 and diode CR16 is in parallel to resistor RA and diode CRA of the auxiliary stage. One end of resistor R12 is connected to bus 10; the other end is connected to the anode of diode CR16. The cathode of CR16 is then connected to the anode of four-layer diode QA. Triggering capacitor CA is connected between the anode of diode CR16 in the auxiliary stage and the cathode of four-layer diode Q0 in stage zero. When the auxiliary stage is triggered into conduction, a negative going pulse will be generated at the anode of diode CR16 and will be coupled through capacitor CA to the cathode of diode Q0 in stage zero, thus triggering stage zero into conduction immediately after the auxiliary stage has been triggered into conduction. Diode CR13 in the zero stage circuit allows the negative pulse from the auxiliary stage to develop at the cathode of Q0 and prevents it from being shorted directly to bus 11.

The negative going CARRY signal is taken from the anode of diode CRA in the auxiliary stage. Note that the CARRY signal and the RESET signal are taken from separate parallel connected networks in the anode circuit of four-layer diode QA. This effectively isolates the CARRY signal from the RESET signal and prevents spurious CARRY signals from being generated each time the switch is closed, as was found to be the case when both the CARRY signal and the RESET signal were taken from the same point in the auxiliary stage. The reasons for this are as follows. In normal operation, triggering capacitor CA is charged so that the plate which is connected to stage zero is at the negative potential of switching bus 11 and the plate connected to the auxiliary stage is at the positive potential of bus 10. When the switch is actuated, the voltage across the two buses is collapsed, which in reality amounts to bringing the potential of bus 11 essentially to the ground potential of bus 10. This raises the potential appearing on the plate of capacitor CA which is connected to stage zero and consequently raises the potential on the other plate as well, resulting in a positive pulse being coupled back to the point of connection of capacitor CA with the auxiliary stage, raising that point to a voltage above the voltage of main bus 10. If the CARRY signal were taken from the same point, a false CARRY signal would be generated by charging current of CA when the bus 11 fell to its normal level.

It was found that during normal operation of the counter, as successive stages were turned on, negative pulses would be coupled through the triggering capacitors and appear across load resistor RA of the auxiliary stage, resulting in negative going pulses appearing on the CARRY signal output. These pulses would become greater in amplitude the closer the conducting stage was to the auxiliary stage, and, depending upon the threshold level of the succeeding counter, might result in a spurious turn-on of that counter. To prevent this, blocking diode CR19 is inserted between triggering capacitor C9 and the anode of four-layer diode QA in the auxiliary stage. Since capacitor C9 is connected to the anode of diode CR19, negative pulses coupled through capacitor C9 will be blocked by diode CR19 from entry into the auxiliary stage. Since blocking diode CR19 is inserted in the lead to capacitor C9, an additional charge path is needed for C9 when stage nine is conducting. This is provided by connecting resistor R27 between main bus 10 and capacitor C9. An additional diode CR20 has its anode connected to resistor R27 and its cathode to C9 in order to prevent the charge on the capacitor from bleeding upward through resistor R27 when stage nine is switched off.

The SET function, that is, putting the zero stage into conduction regardless of the state of conduction of the other stages, is effected by applying a positive pulse to SET terminal 14. This pulse is coupled through diode CR17, capacitor C11 and resistor R13 to the anode of four-layer diode Q0, triggering Q0 into conduction. A charge path for capacitor C11 is provided by connecting one side of it to the minus 24 volt D.C. supply by means of resistor R14.

The arrangement of the RESET feedback loop provides a convenient means for cascading several of these decade counters in order to create counters of 20 counting units, or of any higher multiple of 10. To cascade two counters, for instance, the RESET feedback loop is opened at a point indicated in FIG. 1 by the dotted "X" 20. The free end of that portion of the loop attached to the auxiliary stage is connected to the anode of diode CR13 in the zero stage of the next counter. The free end of the portion of the loop attached to the zero stage is connected to the anode of diode CR16 in the auxiliary stage of the next counter. The input circuits of the switching transistors of both counters would be connected in parallel across the secondary 18 of pulse transformer T, with both tandem-connected counters being driven by the same switching signal through a single pulse transformer.

*Clearing*

It is desirable to provide a simple and efficient means for clearing the counter, that is, for rendering all stages nonconductive. This has been accomplished in the counter of this invention by disabling the triggering capacitors when the transistor switch QS is actuated for a period greatly in excess of a normal switching period. In order to disable any clearing capacitor which would be charged, it is necessary to provide a means for bleeding off sufficient of the capacitor charge during the clearing period to prevent the capacitor from triggering on the next succeeding stage when the switch is turned off. The high back resistance of the conventional diodes in each stage is not suitable as a discharge path, since this resistance varies widely with temperature and varies considerably from diode to diode. Therefore, a resistor has been placed in parallel with each of these diodes to provide a capacitor discharge path. Thus resistor R17 is in parallel with diode CR1, resistor R18 in parallel with diode CR2, resistor R24 in parallel with diode CR9 etc., for each succeeding stage, winding up with resistor R25 in parallel with diode CR16. The clearing period is 250 microseconds, and the RC constant of each resistor-capacitor combination is therefore selected so that only a negligible portion of the voltage on the capacitor will be allowed to leak off during the normal switching period of 5 microseconds, but substanitally all of it will leak off during the clearing period. To clear the circuit, a pulse of 250 microseconds duration and of the appropriate polarity (negative with respect to ground) is applied to CLEAR terminal 19 and is coupled to the base of switching transistor QS through resistor R26, thus turning on QS for the appropriate period. Diode CR21 in series with secondary winding 18 of transformer T prevents the CLEAR signal from being shorted to ground when the impedance of the pulse transformer collapses after 5 microsecoinds.

*Enhancement of stage turnoff*

As has been stated previously, in a conventional counter of this type the switch, usually a semiconductor device, is connected directly between the two buses. When it is actuated, the voltage across the buses is collapsed except for the small voltage existing across the switch. This voltage collapse, although not complete, is normally enough to turn off any conducting stage. However, most threshold devices, including four-layer diodes, will drop out of conduction much faster if the voltage across their terminals is actually reversed, rather than merely being collapsed. Such reversal also provides a more positive turnoff. Provision has been made in the counter of this invention for reversing the voltage across the four-layer diodes when the switch QS is actuated.

It will be seen that the terminals for switching transistor QS are connected directly between ground and switching bus 11, so that when the transistor conducts, bus 11 will be negative with respect to ground only by that small potential drop existing across the conducting transistor. Resistor R11 is inserted between bus 11 and the minus 24 volt supply lead so that during the switching period the 24 volt drop may be developed across it. It prevents the actuation of the switch from shorting the minus 24 v. D.C. line to ground. By means of a voltage divider, main bus 10 is maintained at a voltage slightly more negative with respect to ground than that of bus 11 when the switch is actuated. Thus, during the switching period, bus 11 will actually be positive with respect to bus 10, effectively reversing the polarity across the semiconductor four-layer diodes and facilitating their turnoff.

In the embodiment of FIG. 1, the voltage divider comprises the series combination of silicon diodes CR14 and CR15 and resistor R28. The two silicon diodes are connected between ground and main bus 10 and resistor R28 between main bus 10 and the minus 24 volt D.C. line. The forward conducting voltage drop across the two diodes is sufficient to keep bus 10 at a potential of about minus 2 volts with respect to ground at all times. Since the voltage drop across the conducting transistor is of the order of less than one volt, this arrangement will provide the required voltage reversal upon actuation of the switching transistor. Because of the characteristic logarithmic voltage-current characteristic of silicon diodes, this voltage drop tends to remain constant regardless of the amount of current drawn through the diodes. It will remain essentially constant regardless of whether or not a stage is conducting. There will therefore be little or no jitter on main bus 10 as stages are triggered in and out of conduction by the switch.

The charge on the triggering capacitor connecting the conducting stage to the previous stage will also aid in keeping the anode of the four-layer diode negative during the switching period. Since the zero stage four-layer diode Q0, which is triggered through its cathode, has no triggering capacitor connected to its anode, capacitor C13 has been added to facilitate turn-off. Capacitor C13 is connected between main bus 10 and the anode of diode CR12. Diode CR12 isolates the set signal from capacitor C13. For the same reason, the auxiliary stage has been provided with a capacitor C14 connected between main bus 10 and the anode of four-layer diode QA. While the auxiliary stage has a triggering capacitor C9 already connected to the anode of diode QA, any negative going pulse coupled through this capacitor which would help to hold the anode of four-layer diode QA negative during the switching period would be blocked by diode CR19.

Capacitor C15 is a large filter capacitor which is connected across the voltage supply and decouples the supply from any transient voltages generated in this counter.

FIG. 2 shows a fragment of the upper lefthand portion of the schematic diagram of FIG. 1 in which a slight modification has been made to provide a somewhat different divider network for maintaining the negative voltage on main bus 10 necessary for polarity reversal. The series connected diodes CR14 and CR 15 of the embodiment of FIG. 1 have been replaced by a resistor R29.

The voltage drop across resistor R29 will maintain main bus 10 at approximately the desired minus 2 volts with respect to ground. Since a resistor is a linear element, the voltage drop across it is directly proportional to the current drawn through it. The voltage across R29 will vary between periods of normal operation, when current for conduction of a stage is drawn through it in addition to normal bleeder current, and switching periods after the conducting stage to turned off, when only bleeder current is flowing. This variation in voltage will cause the voltage on main bus 10 to jitter. To minimize this jitter, the resistance values of divider resistors R28 and R29 are adjusted to allow a rather large bleeder current to flow, so that the proportional change in the voltage across R29 due to the additional stage conduction current will be relatively small.

The embodiment of FIG. 1 is preferred because of the greater stability of bus 10 achieved through the logarithmic voltage-current characteristic of the silicon diodes.

What is claimed is:

1. In combination with a counter or the like comprising a first and a second bus; a plurality of cascaded counter stages parallel connected between the buses and having an input supplied with signals to be counted, each stage including at least one active threshold conduction device; means providing a potential difference between said buses of the proper polarity to support conduction in said threshold devices but less than the threshold voltage thereof; switching means adapted, when actuated, to collapse the voltage between said buses so as to stop conduction in any of said threshold devices which may have been conducting; and triggering means adapted to trigger into conduction the threshold devices in the next succeeding stage subsequent to the stopping of conduction in any one stage by actuation of said switching means; clearing signaling means for controlling the actuation of said switching means including a voltage divider connected between the output of said switching means and each of said counter stages, and means for providing a potential difference across said divider, one side of said switching means being connected to said divider at a first connection point and a second side of said switching means being connected to ground potential, said first bus being connected to said divider at a second connection point, the potential difference between said buses being less than the potential difference between said first connection point and said second bus when said switching means is actuated, these connections of said divider during a switching period effectively reversing the polarity across the threshold devices and facilitating their turn off in response to clearing signals transmitted through said divider, said voltage divider being effective each time the count is transferred between stages of said counter.

2. The counter or the like of claim 1 in which said voltage divider comprises a resistance divider.

3. The counter or the like of claim 1 in which that portion of said voltage divider between said first and second connection points comprises at least one silicon diode.

4. A counter or the like comprising:
a plurality of cascaded stages,
one of said stages being normally conducting;
switching means adapted, when actuated for a switching period, to render nonconductive said one stage and all of said stages spuriously conducting at that time;
triggering means adapted, upon the termination of a switching period, to trigger into conduction one of said stages adjacent to the previously conducting one of said stages;
clearing means adapted, upon actuation of said switching means for a clearing period a predetermined time greater than said switching period, to disable said triggering means,
whereby, at the end of said clearing period, all of said stages are nonconductive.

5. The counter or the like of claim 4 wherein:
said triggering means comprises a plurality of energy storing coupling means,
each said coupling means connecting two adjacent stages,
each said coupling means adapted to store energy from a conducting one of said adjacent stages and to trigger the other of said adjacent stages into conduction by virtue of said stored energy; and
said clearing means includes resistive means connected to said coupling means which are adapted to remove during said clearing period, but not during the shorter switching period, sufficient stored energy from any said energy storing coupling means to render said coupling means ineffective to trigger an adjacent stage into conduction.

6. The counter or the like of claim 5 wherein:
said plurality of energy storing coupling means comprises a plurality of capacitors;
said clearing means comprises a resistor discharge path for each said capacitor, each resistor-capacitor combination having a predetermined time constant such as to provide the desired operation of said clearing means.

7. In a ring counter or the like comprising a plurality of 0 . . . $n$ cascaded counting stages, the improvement comprising:
an auxiliary, noncounting stage succeeding said $n$th counting stage,
said auxiliary stage adapted to be turned on when said $n$th counting stage is turned off;
reset means actuated by said auxiliary stage,
said reset means being adapted to turn on said zero stage upon the turning on of said auxiliary stage,
carry signal means actuated by said auxiliary stage,
said carry signal means being adapted to supply a carry signal for application to a subsequent counter upon the turning on of said auxiliary stage.

8. The ring counter or the like of claim 7 in which
said reset means and said carry signal means are isolated from each other by at least one diode
whereby the generation of spurious signals caused by interaction between said reset means and said carry signal means is prevented.

9. The ring counter or the like of claim 7 having
a triggering capacitor interconnecting each pair of adjacent stages,
said triggering capacitor being adapted to trigger into conduction the succeeding one of the pair of stages which it interconnects by coupling thereto a voltage pulse of the proper polarity,
the plurality of said triggering capacitors also acting to couple from stage to stage voltage pulses of the opposite polarity to those required for triggering said stages into conduction, said voltage pulses of opposite polarity being capable of causing spurious outputs from said auxiliary stage;
a diode in series with that one of said triggering capacitors which connects said $n$th stage with said auxiliary stage, said diode effective to block said pulses of opposite polarity from reaching said auxiliary stage.

10. The ring counter of claim 7, in which switching means is provided, adapted, when activated to render a conducting stage nonconductive, each of the stages including the auxiliary stage having as an active element a four-layer diode with a cathode and an anode circuit, the anode circuit of the auxiliary stage including two parallel-connected diode networks from which the carry signal and a reset signal are separately taken so as to isolate these signals from each other and prevent the generation of spurious carry signals each time said switching means is activated.

References Cited by the Examiner

UNITED STATES PATENTS

| | | | |
|---|---|---|---|
| 2,537,383 | 1/1951 | Van Dorsten | 315—340 X |
| 2,669,390 | 2/1954 | Manley | 328—43 X |
| 3,016,470 | 1/1962 | Van Dine | 328—37 X |
| 3,021,450 | 2/1962 | Jiu | 315—84.5 |
| 3,105,912 | 10/1963 | Johnston | 307—88.5 |

ARTHUR GAUSS, *Primary Examiner.*